(12) United States Patent
Kilian et al.

(10) Patent No.: US 9,184,832 B2
(45) Date of Patent: Nov. 10, 2015

(54) CONCEPT FOR COMBINING CODED DATA PACKETS

(71) Applicant: Fraunhofer-Gesellschaft zur Foerderung der angewandten Forschung e.V., Munich (DE)

(72) Inventors: Gerd Kilian, Erlangen (DE); Andreas Tasch, Herzogenaurach (DE); Josef Bernhard, Nabburg (DE); Wolfgang Koch, Heroldsberg (DE); Patrick Nickel, Birstein (DE); Wolfgang Gerstacker, Nuremberg (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 63 days.

(21) Appl. No.: 13/740,489

(22) Filed: Jan. 14, 2013

(65) Prior Publication Data

US 2013/0128876 A1    May 23, 2013

Related U.S. Application Data

(63) Continuation of application No. PCT/EP2011/062118, filed on Jul. 15, 2011.

(30) Foreign Application Priority Data

Jul. 15, 2010  (DE) .......................... 10 2010 031 411

(51) Int. Cl.
*H03M 7/00* (2006.01)
*H04L 12/56* (2006.01)
(Continued)

(52) U.S. Cl.
CPC ......... *H04B 7/2643* (2013.01); *H03M 13/6306* (2013.01); *H03M 13/6362* (2013.01);
(Continued)

(58) Field of Classification Search
USPC .................................. 370/347, 310
See application file for complete search history.

(56) References Cited

U.S. PATENT DOCUMENTS 5,438,590 A * 8/1995 Tzukerman et al. .......... 375/259
6,807,648 B1 10/2004 Cansever et al.
(Continued)

FOREIGN PATENT DOCUMENTS

| CN | 101444048 A | 5/2009 |
|---|---|---|
| EP | 2 025 113 B1 | 3/2012 |
| WO | 2007/142482 A1 | 12/2007 |

OTHER PUBLICATIONS

Official Communication issued in International Patent Application No. PCT/EP2011/062118, mailed on Mar. 21, 2012.
(Continued)

*Primary Examiner* — Edan Orgad
*Assistant Examiner* — Sithu Ko
(74) *Attorney, Agent, or Firm* — Keating & Bennett, LLP

(57) ABSTRACT

Concept for transmitting payload data from a transmitter to a receiver via a communication channel within a time interval, wherein channel-coded data packets are generated from the payload data, wherein each of the channel-coded data packets has packet core data corresponding to a packet identification of the respective channel-coded data packet, and wherein the packet core data is coded with a channel code of higher redundancy than the payload data. The channel-coded data packets are sent without any return channel to the receiver, which decodes packet core data of a first received channel-coded data packet of the time interval. If error-free decoding of the first channel-coded data packet fails, packet core data of at least one second received channel-coded data packet of the time interval are decoded to determine a suitable further channel-coded data packet for combination with the first channel-coded data packet to acquire, on account of the combination, an increased code gain for decoding of the payload data.

28 Claims, 6 Drawing Sheets

(51) Int. Cl.
*H04J 3/24* (2006.01)
*H04B 7/26* (2006.01)
*H03M 13/00* (2006.01)
*H04L 1/00* (2006.01)
*H03M 13/09* (2006.01)
*H03M 13/23* (2006.01)
*H04L 1/18* (2006.01)

(52) U.S. Cl.
CPC .............. *H04L1/007* (2013.01); *H04L 1/0072* (2013.01); *H04L 1/0083* (2013.01); *H03M 13/09* (2013.01); *H03M 13/23* (2013.01); *H04L 1/1819* (2013.01); *H04L 2001/0092* (2013.01)

(56) References Cited

U.S. PATENT DOCUMENTS

| | | | | |
|---|---|---|---|---|
| 7,590,121 | B2 * | 9/2009 | de Mier | 370/394 |
| 8,020,065 | B1 * | 9/2011 | Gaur | 714/755 |
| 2002/0015405 | A1 * | 2/2002 | Sepponen et al. | 370/389 |
| 2003/0156663 | A1 * | 8/2003 | Burkert et al. | 375/341 |
| 2004/0258092 | A1 | 12/2004 | Sugaya | |
| 2008/0130534 | A1 | 6/2008 | Tomioka | |
| 2010/0122143 | A1 * | 5/2010 | Lee et al. | 714/752 |

OTHER PUBLICATIONS

Ericsson,"Transmission mode for BCCH", 3GPP TSG-RAN WG1 Meeting #51bis, R1-074476, Oct. 8-12, 2007, Shanghai, China, pp. 1-6.

Ericsson et al.,"Graceful RACH overload relief", 3GPP TSG GERAN #46, GP-100896, Apr. 17-21, 2010, Jeju, South Korea, 13 pages.

Panasonic,"Synchronous retransmissions for E-DCH", 3GPP TSG-RAN WG2 Ad Hoc Meeting, R2-041281, Jun. 21-24, 2004, Cannes, France, pp. 1-4.

Qualcomm Europe et al.,"Principles for the new CELL_PCH/ URA_PCH operation", 3GPP TSG-RAN WG2 Meeting #57bis, R2-071504, Mar. 27-30, 2007, Malta, France, 2 pages.

Ericsson,"E-UTRA uplink radio access", TSG-RAN WG1 AdHoc on LTE, R1-050620, Jun. 20-21, 2005, Sophia Antipolis, France, pp. 1-6.

Official Communication issued in corresponding Chinese Patent Application No. 2011800447081, mailed on Jan. 7, 2015.

Ericsson, "Enhanced CELL_FACH", 3GPP TSG RAN WG2 #56, Tdoc R2-063209, Nov. 6-10, 2006, pp. 1-4.

Sun, Z. et al., "Adaptive Two-level Unequal Error Protection Convolutional Code Scheme for Wireless ATM Networks", Nineteenth Annual Joint Conference of the IEEE Computer and Communications Societies, Mar. 26-30, 2000, vol. 3, pp. 1693-1697.

Official Communication issued in corresponding European Patent Application No. 15161461.7, mailed on Aug. 5, 2015.

* cited by examiner

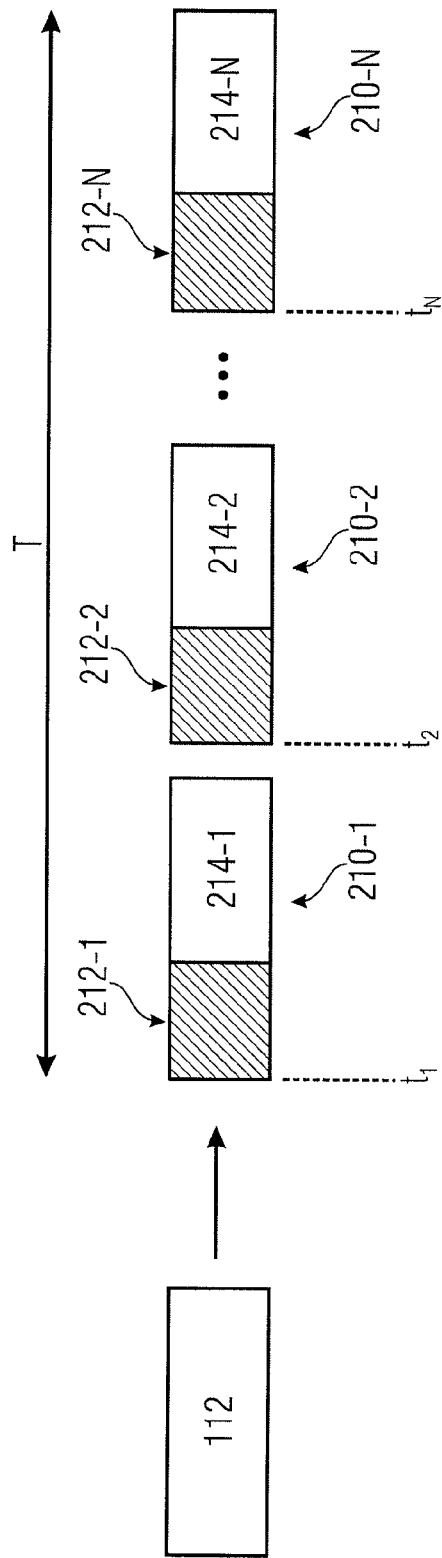

CONCEPT FOR COMBINING CODED DATA PACKETS

CROSS-REFERENCE TO RELATED APPLICATIONS

This application is a continuation of copending International Application No. PCT/EP2011/062118, filed Jul. 15, 2011, which is incorporated herein by reference in its entirety, and additionally claims priority from German Application No. 102010031411.0, filed Jul. 15, 2010, which is also incorporated herein by reference in its entirety.

BACKGROUND OF THE INVENTION

The present invention relates to a concept for transmitting payload data (useful data, Nutzdaten) in the form of a plurality of coded data packets that may be combined, at the receiving end, such that they are adapted to a transmission quality, so as to adapt a coding gain to the transmission quality and/or to a transmission situation. Embodiments of the present invention may be employed, in particular, in unidirectional multipoint-to-point transmission systems.

For transmitting small payload data quantities as arise, e.g., with measuring devices, such as heating, electricity or water meters, for example, two different transmission modes may be employed, in principle. For one thing, sensor and/or payload data may be transmitted from a transmitter associated with the measuring device in question to a central receiver by means of unidirectional transmission (multipoint-to-point transmission). With such unidirectional transmission, the transmitter cyclically transmits its transmitter identification and a current sensor value at specific transmission times, which in most cases are selected randomly. Time lags between the transmission times are mostly adapted to a battery characteristic and selected such that a battery life becomes maximal. In this context, the transmitter will receive no confirmation whatsoever from the central receiver concerning the receipt of the sensor value, i.e. it has no knowledge of whether or not a transmission packet containing the sensor value has arrived at the receiver and/or has been able to be decoded. If, however, such an acknowledgement of receipt (ACK/NAK) is desired, one may fall back on bidirectional transmission.

In bidirectional transmission, a transceiver is provided at the sensor end. The transceiver transmits its sensor data and/or data packets only when asked to do so by a remote-side sensing device (central receiver). To this end, the sensor-end transceiver must constantly listen in to a radio channel to find out whether or not there is a transmission request directed at it.

For sensor and/or payload data transmission, so-called (wireless) sensor networks are also being used more and more frequently, wherein information about individual subscribers or nodes of the network are relayed until they eventually arrive at the desired information receiver. In this manner, data may be routed over a long distance if sensor nodes exist accordingly.

For sensor and/or payload data transmission, simple low-cost telemetry transceivers comprising amplitude (ASK) or frequency modulation (FSK) are mostly employed in the above-mentioned system approaches. In this context, reception is often not coherent, and in most cases no channel coding is utilized.

In contrast, in more complex digital wireless communication systems, transmission modes are used nowadays which transmit information and/or payload data such that they are distributed to different data packets that are sent out in a temporally and/or spatially offset manner, and such that they have different redundancy information, i.e. are channel-coded differently. Given high signal quality, i.e. a high signal-to-noise ratio (SNR), the coded data packets may be received and decoded individually. If the SNR at the receiver decreases, a code gain or coding gain may be realized by combining two or more data packets received. In coding theory, the code gain describes a difference of a required bit energy in relation to a noise power spectral density between an uncoded and a coded message in order to achieve an identical bit error rate. The uncoded message represents the reference with which the message coded by means of channel coding is compared. Such transmission modes, which are also referred to as code-combining and/or incremental-redundancy transmission modes, have been frequently applied, in conventional art, with so-called packet-oriented automatic repeat request protocols (ARQ protocols). If an error arises, at the receiving end, in decoding a data packet, a further data packet with redundancy, i.e. a further coded data packet, is requested at the transmitter via a return channel.

ARQ protocols are used in communication networks to guarantee reliable data transmission by means of repeat transmissions. By means of a possibility of error recognition, a receiver may ascertain any transmission errors that have occurred in data packets. Via the return channel, said receiver may communicate the result of the error recognition to the transmitter of the data packet. This is usually effected by transmitting so-called ACK/NAK signals (acknowledgement or negative acknowledgement, i.e. correct receipt confirmed, or request for repetition). If need be, a disturbed message is retransmitted until such time as it has reached the receiver without any errors.

So-called hybrid ARQ protocols (HARQ) represent an extended variant of the ARQ protocol, which comprises combining ARQ mechanisms, such as check sum formation, block confirmation and/or block repetition, with error-correcting coding. In this context, payload data may be channel-coded with an error-correcting block code or an error-correcting convolution code. I.e., unlike ARQ methods, wherein only error-recognizing redundancy information (e.g. CRC) is transmitted in addition to the payload data in a data packet, HARQ methods additionally comprise transmission of error-correcting redundancy information in the data packet in accordance with forward error correction methods (FEC methods). One may basically distinguish between three different types of HARQ methods:

The simplest version, type I HARQ, adds both error-recognizing and error-correcting redundancy information to the payload data prior to each transmission so as to obtain a coded data packet. When the coded data packet is received, the receiver first of all decodes the error-correcting channel code. Given sufficient transmission quality, all of the transmission errors should be correctable, and the receiver should thus be able to obtain the correct payload data. If the transmission quality is poor, and if, consequently, not all of the transmission errors can be corrected, the receiver may ascertain this by means of the error-recognizing code. In this case, the coded data packet received is discarded, and repeat transmission is requested via a return channel. Thus, type I HARQ designates transmission with perfectly identical repetition of the data sent in the initial transmission. Upon renewed reception of the data, information that was generated in the previous reception of said data may be reused. A possible principle for this is known from IEEE Transactions on Communications, Vol. COM-33, No. 5, May 1985, D. Chase, "Code Combining—A Maximum-Likelihood Decoding Approach for Combining an Arbitrary Number of Noisy Packets". In this context, payload data is transmitted in data packets that are coded with a code having a relatively high code rate R and that are repeated to achieve reliable communication if the redundancy of the code is not sufficient to overcome, e.g., channel interference problems. The receiver combines received noisy data packets to obtain a combined data packet having a code rate R'<R small enough to ensure reliable combination even with transmission channels that cause extremely high error rates. In this context, one tries to reduce the delay (caused by packet repetitions) to a minimum by combining a minimum number of data packets while realizing a sufficiently good and high code rate in order to reliably decode the payload data transmitted.

In accordance with a further conventional method, logarithmic likelihood ratios (LLR—log likelihood ratios) for payload data of the previously transmitted data packet, said payload data having to be decoded, are determined during a decoding attempt of a previously transmitted data packet. If a decoding attempt fails, renewed transmission of the corresponding data packet is effected. For decoding the payload data of the newly sent data packet, the LLRs determined during the previous decoding attempt are utilized as a-priori information in a forward-moving procedure, similar to the known turbo-code principle.

With type II HARQ, a repeat transmission does not involve repeating precisely the data of the initial transmission, but involves transmitting additional redundancy that would not be decodable on its own without the data of the initial transmission (non-self-decodable). Such type II HARQ methods are typically also referred to as incremental-redundancy HARQ methods. In this context, the payload data and error-recognizing bits (CRC) are initially coded at the transmitter end, for example by means of a systematic "parent" code. This results in a code word consisting of systematic bits and so-called parity bits. In the first data packet sent, the systematic portion of the code word and a specific number, i.e. not all, of the parity bits which together form a code word of a parent code are sent. Said code word is coded at the receiver end. If this is not possible and if repeat transmission is requested, the transmitter will transmit, in a subsequent data packet, additional parity bits of possibly different powers and/or at altered channel conditions. Upon reception of the subsequent data packet, a new decoding attempt is made, which involves combining the additional parity bits with the ones previously received. This process can be repeated until such time as all of the parity bits of the parent code have been transmitted.

As was already described at the outset, there are simple digital wireless communication systems comprising only unidirectional transmission from the transmitter to the receiver, i.e. without any return channel. Such unidirectional multipoint-to-point communication systems are particularly suitable for low-cost transmission of small quantities of payload data as arise, e.g., with measuring devices, for example heating, electricity or water meters. However, with such communication systems, wherein a multitude of transmitters communicate with one receiver (multipoint-to-point), there is the problem that substantial interference may result at the receiver, depending on the number of transmitters and their random transmission times. Due to random transmission times of the transmitters and their number, which is often not predictable either, the interference or reception quality achieved at the receiver is not predictable. Nevertheless, it is to be ensured that transmitter-specific payload data can be decoded fast, efficiently and reliably at the central receiver even under most diverse receiving conditions.

SUMMARY

According to an embodiment, a transmitter for transmitting payload data via a unidirectional communication to a receiver within a time interval may have: a means for generating a plurality of channel-coded data packets from the payload data, each of the channel-coded data packets having packet core data corresponding to a packet identification which is different for each data packet, and the packet core data being coded with a channel code of a higher redundancy than the payload data; and a means for transmitting the plurality of channel-coded data packets to the receiver within the time interval, the means for transmitting being configured to transmit the plurality of channel-coded data packets from the transmitter to the receiver within the time interval without using a return channel.

According to another embodiment, a receiver for receiving payload data transmitted from a transmitter to the receiver via a unidirectional communication to the receiver within a time interval by means of a plurality of channel-coded data packets, the receiver having no return channel that would lead to the transmitter for causing the transmitter to repeatedly transmit a channel-coded data packet in the event that decoding of the payload data has failed, each of the channel-coded data packets having packet core data corresponding to a packet identification of the respective channel-coded data packet, and the packet core data being coded with a channel code of higher redundancy than the payload data, may have: a means for receiving the plurality of channel-coded data packets within the time interval; and a decoder adapted to decode packet core data of a first received channel-coded data packet of the time interval, and, in the event of failure of error-free decoding of the first channel-coded data packet, to decode packet core data of at least one second received channel-coded data packet of the time interval so as to determine a suitable further channel-coded data packet of the time interval for combination with the first channel-coded data packet so as to obtain, on account of the combination, an increased code gain for decoding of the payload data.

According to another embodiment, a system for transmitting payload data from a transmitter to a receiver via a unidirectional communication to a receiver within a time interval may have: a means for generating a plurality of channel-coded data packets from the payload data, each of the channel-coded data packets having packet core data corresponding to a packet identification of the respective channel-coded data packet, and the packet core data being coded with a channel code of a higher redundancy than the payload data; a transmitter for transmitting the plurality of channel-coded data packets within the time interval; a receiver for receiving the plurality of channel-coded data packets within the time interval; and a decoder adapted to decode packet core data of a first received channel-coded data packet of the time interval, and, if error-free decoding of the first channel-coded data packet so as to obtain the payload data fails, to decode packet core data of at least one second received channel-coded data packet of the time interval so as to determine a suitable further channel-coded data packet of the time interval for combination with the first channel-coded data packet so as to obtain, on account of the combination, an increased code gain for decoding of the payload data; wherein no return channel is provided between the receiver and the transmitter for causing the transmitter to repeatedly transmit a channel-coded data packet in the event that decoding of the payload data has failed.

According to another embodiment, a method of transmitting payload data via a unidirectional communication to a receiver within a time interval may have the steps of: a generating a plurality of channel-coded data packets from the payload data, each of the channel-coded data packets having packet core data corresponding to a packet identification which is different for each data packet, and the packet core data being coded with a channel code of a higher redundancy than the payload data; and transmitting the plurality of channel-coded data packets to the receiver within the time interval, said transmission of the plurality of channel-coded data packets from the transmitter to the receiver being effected within the time interval without using a return channel.

According to another embodiment, a method of receiving payload data transmitted from a transmitter via a unidirectional communication to a receiver within a time interval by means of a plurality of channel-coded data packets, each of the channel-coded data packets having packet core data corresponding to a packet identification which is different for each data packet, and the packet core data being coded with a channel code of higher redundancy than the payload data, may have the steps of: receiving the plurality of channel-coded data packets within the time interval; decoding packet core data of a first channel-coded data packet of the time interval; and in the event of failure of decoding of the first channel-coded data packet, decoding packet core data of at least one second channel-coded data packet of the time interval so as to determine a suitable further channel-coded data packet of the time interval for combination with the first channel-coded data packet so as to obtain, on account of the combination, an increased code gain for decoding of the payload data, said decoding of the packet core data being effected independently of a return channel from the receiver to the transmitter without causing repeated transmission of a channel-coded data packet in the event that decoding of the payload data has failed.

Another embodiment may have a computer program for performing the above methods, when the computer program runs on a computer or microcontroller.

According to another embodiment, a receiver for receiving payload data transmitted from a transmitter to the receiver via a communication channel within a time interval by means of a plurality of channel-coded data packets, each of the channel-coded data packets having packet core data corresponding to a packet identification of the respective channel-coded data packet, and the packet core data being coded with a channel code of higher redundancy than the payload data, may have: a means for receiving the plurality of channel-coded data packets within the time interval; and a decoder adapted to decode packet core data of a first received channel-coded data packet of the time interval, and, in the event of failure of error-free decoding of the first channel-coded data packet, to decode packet core data of at least one second received channel-coded data packet of the time interval so as to determine a suitable further channel-coded data packet of the time interval for combination with the first channel-coded data packet so as to obtain, on account of the combination, an increased code gain for decoding of the payload data; wherein the decoder is configured to determine and utilize information about a transmitter-specific deviation of an actual transmitting frequency of the transmitter from a nominal transmitting frequency for decoding the packet core data of the at least second channel-coded data packet of the transmitter and of the time interval, such that channel-coded data packets received with the transmitter-specific deviation may be associated with the transmitter.

According to another embodiment, a receiver for receiving payload data transmitted from a transmitter to the receiver via a communication channel within a time interval by means of a plurality of channel-coded data packets, each of the channel-coded data packets h packet core data corresponding to a packet identification of the respective channel-coded data packet, and the packet core data being coded with a channel code of higher redundancy than the payload data, may have: a means for receiving the plurality of channel-coded data packets within the time interval; and a decoder adapted to decode packet core data of a first received channel-coded data packet of the time interval, and, in the event of failure of error-free decoding of the first channel-coded data packet, to decode packet core data of at least one second received channel-coded data packet of the time interval so as to determine a suitable further channel-coded data packet of the time interval for combination with the first channel-coded data packet so as to obtain, on account of the combination, an increased code gain for decoding of the payload data; wherein the decoder is configured to utilize information about the time interval for decoding the packet core data of the at least second channel-coded data packet from the transmitter and of the time interval, such that starting from the first channel-coded data packet, the at least second channel-coded data packet was received one time period, which corresponds to the time interval, earlier or later at a maximum.

The finding of the present invention consists in achieving the above object by using code combining and/or incremental redundancy in a wireless, unidirectional multipoint-to-point transmission system without return channel from the central receiver to the individual transmitters. In an inventive multipoint-to-point transmission system, a plurality of subscribers, or transmitters, transmit their respective payload data in the form of coded data packets to a central receiver at a random or pseudorandom transmission time in each case. Transmission of the coded data packet associated with a payload data packet takes up a specific transmission time interval T in each case. Given a large number of transmitters M, many data packets from different transmitters will arrive at the central receiver at the same time, which leads to increased interference at the receiver and, thus, to aggravated receiving conditions. In accordance with an embodiment of the present invention, the transmitters transmit their respective payload data within their transmission time interval T by means of N coded data packets, which may comprise different redundancy information and/or are coded differently. Depending on the transmission quality, in the receiver, a channel-coded data packet may then be decoded by itself, or several channel-coded receive packets of a subscriber may be combined so as to obtain an overall higher redundancy and/or a higher code gain on account of the combination. The generator polynomials for the convolution encoder and puncturing schemes for differently coding the payload data into N coded data packets are selected such that at the receiver, a coded data packet may be decoded by itself, but also several data packets may be decoded together.

In a non-synchronous multipoint-to-point transmission system without return channel, the receiver may possibly have to sort a large number of receive packets (M·N per transmission time interval T) so as to combine the proper data packets. Since the transmission times of the coded data packets are random or pseudorandom, the receiver will not be readily able to recognize which receive packets belong together. This will be the case, in particular, if the receiver and/or the transmitters are mobile. It would take up too much computing time to try out all of the possible combinations of data packets, and it would not be possible, or necessitate a large amount of computing expenditure, to operate the system in real time.

The inventive approach may also be advantageously employed for increasing the effective range of the transmission system. In addition, for example the receiver and/or at least some (or all) of the transmitters of the transmission system may be mobile, and, thus, the distances between transmitter and receiver may change, so that different reception-threshold SNRs may arise due to the different distances. In accordance with the invention, in the receiver, a coded data packet of the transmitter may be decoded by itself, or several data packets of the transmitter may be decoded together. Given a small distance between transmitter and receiver, for example a coded data packet by itself or only a combination of few data packets is sufficient to be able to decode the original payload data. In addition, it is also possible to combine several data packets sent out by a transmitter having an increased distance from the receiver so as to achieve a reduction in the reception-threshold SNR, so that the effective range, i.e. for fixed reception, may be realized by a receiver-end combination of several data packets of the respective transmitter. This approach is advantageous particularly when poor transmission conditions arise for transmissions over long distances.

In accordance with embodiments of the present invention, specific information about a transmitted data packet is accommodated in a core area of the data packet, said core area having improved protection. Said core area is protected by a code of relatively high redundancy which still enables error-free decoding of the core area even with a small signal-to-noise power ratio or signal-to-interference ratio.

Embodiments of the present invention include a transmitter for transmitting payload data to a receiver via a communication channel within the transmission time interval T. The transmitter comprises a means for generating a plurality of channel-coded data from the payload data, each of the channel-coded data packets comprising packet core data having a packet identifications that are different for each data packet, and the packet core data being coded with a channel code of higher redundancy than the payload data. The higher redundancy of the coded packet core data relates to the respective redundancy, associated with the payload data, of a data packet. That is, the packet core data redundancy per coded data packet is higher than the payload data redundancy of the coded data packet. Moreover, the transmitter comprises a means for transmitting the plurality of channel-coded data packets to the receiver within the transmission time interval.

In accordance with an embodiment, the redundancy of the channel code for the packet core data is selected such that a threshold of the decodability of the packet core data is at least as good as a threshold achieved when combining all of the possible N data packets. In other words, a code gain of the channel code used for the packet core data is at least as high as a code gain with regard to the coded payload data, the latter code gain being achieved by combining all of the channel-coded data packets of the transmission time interval T. Therefore, for example, a code rate of the channel code used for the packet core data is equal to or lower than a code rate of the coded payload data, the latter code rate being achieved by combining all of the channel-coded data packets of the transmission time interval T.

In accordance with an embodiment, wherein the transmitter is employed in a multipoint-to-point transmission system, the means for generating the channel-coded data packets is configured to provide each of the channel-coded data packets with packet core data corresponding to the packet identification of the respective channel-coded data packet, and to at least a portion of a transmitter identification of the transmitter. That is, in the packet core data domain, a transmitter ID or a transmitter sub ID and a number n (n=1, 2, ..., N) of the associated data packet may be stored so as to ensure, at the receiver end, that only different data packets of a transmitter are combined with one another.

Since an inventive transmitter may be employed in a low-cost unidirectional transmission system, the means for transmitting is configured, in accordance with embodiments, to transmit the plurality of channel-coded data packets from the receiver to the transmitter within the transmission time interval T in a manner that is independent of a return channel with regard to content and transmission times. I.e., transmission of the plurality of channel-coded data packets is effected independently of reception of the plurality of channel-coded data packets and/or of success or failure of decoding the payload data.

Embodiments of the present invention further include a receiver for receiving the payload data transmitted from an inventive transmitter to the receiver via a communication channel within a time interval T by means of a plurality of channel-coded data packets. Each of the channel-coded data packets comprises packet core data having a packet identification of the respective channel-coded data packet, the packet core data being coded with a channel code of higher redundancy than the payload data. The receiver comprises a means for receiving the plurality of channel-coded data packets within the time interval T, and a decoder adapted to decode packet core data of a first received channel-coded data packet of the time interval, and, in the event of failure of error-free decoding of the first channel-coded data packet, to decode packet core data of at least one second received channel-coded data packet of the time interval T so as to determine a suitable further channel-coded data packet of the time interval for combination with the first channel-coded data packet so as to obtain, on account of the combination, an increased code gain for decoding of the payload data.

Combining of received channel-coded data packets will only take place, therefore, if the redundancy information, or the error-corrected redundancy information, of a first received channel-coded data packet is not already sufficient for error-free decoding of the payload data. This is the case, for example, in the event of poor receiving conditions (e.g. low SNR). To this end, the receiver is configured, in accordance with embodiments, to combine the channel-coded first data packet with a further second data packet into a new (longer) data packet, i.e. to reverse the puncturing in accordance with the scheme in the transmitter and to decode said combined longer data packet so as to obtain the increased code gain.

Since, in accordance with embodiments, the receiver is a central receiver in a unidirectional multipoint-to-point transmission system, the receiver does not have, in accordance with an embodiment, any return channel that would lead to any transmitter, so that the transmitter cannot be caused to repeatedly transmit a channel-coded data packet in the event that decoding of the payload data has failed.

At least one transmitter and one receiver in accordance with embodiments of the present invention may be combined into a system for transmitting payload data from the at least one transmitter to the receiver within a time interval. The system then comprises a means for generating a plurality of channel-coded data packets from the payload data, each of the channel-coded data packets comprising packet core data corresponding to a packet identification of the respective channel-coded data packet, and the packet core data being coded with a channel code of higher redundancy than the payload data. In addition, a transmitter is provided for transmitting the plurality of channel-coded data packets within the time interval. The system also includes a receiver for receiving the plurality of channel-coded data packets within the time interval. Said receiver is coupled to a decoder adapted to decode packet core data of a first received channel-coded data packet of the time interval, and, in the event of failure of error-free decoding of the first channel-coded data packet, to decode packet core data of at least one second received channel-coded data packet of the time interval so as to determine a suitable further channel-coded data packet of the time interval for combination with the first coded data packet so as to obtain, on account of the combination, an increased code gain for decoding of the payload data.

Thus, embodiments of the present invention enable effective utilization of incremental redundancy and/or code combining even for unidirectional transmission modes without return channel, in particular in multipoint-to-point transmission systems wherein many subscribers transmit data to a central receiving point. As a result, a larger transmission range may be achieved than in conventional art by reducing a signal-to-noise ratio at the receiver. Alternatively, it is also possible to reduce the transmitting power necessitated while maintaining the transmission range. In addition, higher transmission reliability also results in the case of time-variant transmission channels as arise, for example, on account of mobile transmitters and/or receivers. I.e., the present invention enables incremental redundancy and/or code combining at the receiver without using a return channel from the receiver to a transmitter for this purpose.

BRIEF DESCRIPTION OF THE DRAWINGS

Embodiments of the present invention will be explained in more detail below with reference to the accompanying figures, wherein:

FIG. 2 shows a schematic representation of the generation of a plurality of channel-coded data packets from a payload data packet in accordance with an embodiment of the present invention;

DETAILED DESCRIPTION OF THE INVENTION

Figure 1:
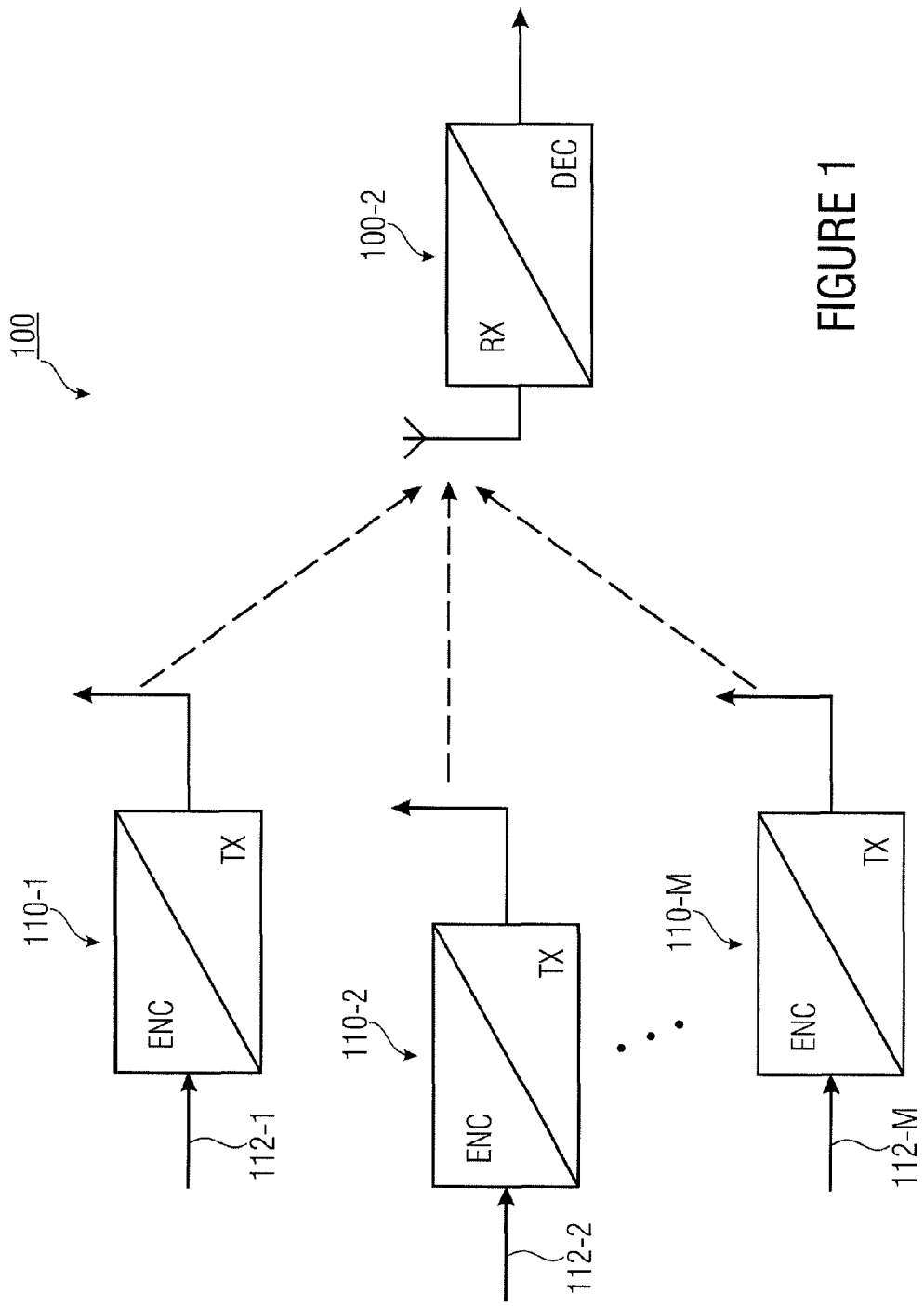
FIG. 1 shows a schematic representation of a unidirectional multipoint-to-point communication system comprising a plurality of transmitters and a central receiver in accordance with embodiments of the present invention.

FIG. 1 schematically shows a multi-subscriber communication system 100 wherein a plurality of transmitters 110-$m$ (m=1, 2, . . . , M) unidirectionally transmit their payload data 112-$m$ to a central receiver 120 in each case, i.e. there is no return channel from the receiver 120 to any of the transmitters 110-$m$ (m=1, 2, . . . , M).

Each of the transmitters 110-$m$ (m=1, 2, . . . , M) comprises a means ENC for generating a plurality of channel-coded data packets from the payload data 112-$m$ (m=1, 2, . . . , M). This may be interpreted to mean that the payload data 112-$m$ (m=1, 2, . . . , M), which is to be transmitted within a transmission time interval in each case, has the plurality of channel-coded data packets associated with it. In addition, each transmitter 110-$m$ (m=1, 2, . . . , M) comprises a means (transmitting unit) TX for transmitting the plurality of channel-coded data packets to the receiver 120 within the time interval.

One of the transmitters 110-$m$ (m=1, 2, . . . , M) and/or the means ENC for generating the plurality of channel-coded data packets is to be explained in more detail by means of FIGS. 2-5. For clarity's sake, the subscriber index m (m=1, 2, . . . , M) shall be omitted in most cases below.

FIG. 2 illustrates that the means ENC is configured to form a plurality of channel-coded data packets 210-$n$ (n=1, 2, . . . , N) from the payload data 112, each of the channel-coded data packets 210-$n$ (n=1, 2, . . . , N) comprising packet core data 212-$n$ (n=1, 2, . . . , N) corresponding to a packet identification P-Id$_n$ (n=1, 2, . . . , N) that is different for each data packet, and the packet core data 212-$n$ (n=1, 2, . . . , N) being coded with a channel code of higher redundancy than the payload data 112. This means that for each data packet 210-$n$ (n=1, 2, . . . , N), more redundancy information with regard to the packet core data 212-$n$ (n=1, 2, . . . , N) is transmitted than is redundancy information with regard to the payload data. The payload data 112 and/or redundancy information derived therefrom, such as error-recognizing redundancy information and/or error-correcting redundancy information, is transmitted in the data packets 210-$n$ (n=1, 2, . . . , N) in corresponding data fields 214-$n$ (n=1, 2, . . . , N). In accordance with embodiments, the payload data 112 is transmitted in an undivided manner. Rather, all of the payload data 112 is transmitted in a state where it is coded differently in each of the channel-coded data packets 210-$n$ (n=1, 2, . . . , N), or the payload data 112 is transmitted in a state where it is coded only in a first one 210-1 of the data packets, whereupon only additional redundancy information is subsequently transmitted in the further data packets 210-$n$ (n=2, 3, . . . , N).

Since the channel-coded data packets 210-$n$ generally comprise the coded payload data and/or the coded payload data word together with the redundancy information (data fields 214-$n$), the coded data field 214-$n$ will frequently also be represented as "payload data with redundancy" in the context of the description which follows. It shall be noted that, in accordance with the above explanations referring to FIG. 2, the data fields 214-$n$ may comprise either the coded payload data with the redundancy information derived from the associated payload data 112, or may comprise only redundancy information derived from the associated payload data 112.

The data packets 210-$n$ (n=1, 2, . . . , N) associated with a payload data packet 112 are transmitted from the transmitter 110 to the receiver 120 within a transmission time interval T. In this context, in accordance with an embodiment, the transmitter 110 and/or the means (transmitting unit) TX for transmitting is configured to transmit a first one of the plurality of channel-coded data packets 210-1 at a random time $t_1$, and to subsequently transmit any remaining data packets 210-$n$ (n=2, 3, . . . , N) of the plurality of channel-coded data packets within the transmission time interval T. Thus, the time interval T forms, as it were, a transmission time frame for the channel-coded data packets 210-$n$ (n=1, 2, . . . , N) associated with a payload data word and/or packet 112. Even though within said transmission time frame T the individual data packets 210-$n$ ($n=1, 2, \ldots, N$) may be transmitted at random or pseudorandom transmission times $t_n$ ($n=1, 2, \ldots, N$), time lags $\Delta t = (t_{n+1} - t_n)$ of consecutive data packets 210-$n$, 210-($n+1$) ($n=1, 2, \ldots, n-1$) are determined or predetermined, in accordance with another embodiment, similar to time division multiple access (TDMA). I.e., the means TX for transmitting is configured, in accordance with an embodiment, to transmit the plurality of channel-coded data packets 210-$n$ to the receiver 120 within the time interval T in accordance with time division multiple access.

As was already set forth above, the packet core data 212-$n$ ($n=1, 2, \ldots, N$) include a packet identification, or packet number P-Id$_n$ ($n=1, 2, \ldots, N$) that is different for each data packet 210-$n$ ($n=1, 2, \ldots, N$). In a multi-subscriber system having a plurality of transmitters 110, it is advantageous—although not compulsory—to provide, in the core data domain 212-$n$ of a data packet 210-$n$ ($n=1, 2, \ldots, N$), at least a portion of a transmitter identification S-Id$_m$ ($m=1, 2, \ldots, M$) of the respective transmitter 110-$m$ in addition to P-Id$_n$ ($n=1, 2, \ldots, N$) so as to be able to associate the respective data packet 210-$n$ ($n=1, 2, \ldots, N$) with the correct transmitter 110-$m$ ($m=1, 2, \ldots, M$) at the receiver end. This enables the receiver 120 of a non-synchronous multipoint-to-point transmission system without return channel to sort the possibly large number of receive packets (M·N per time interval T) and to combine the proper data packets with one another. Instead of the transmitter identification, it would also be possible to provide time information indicating the time lag to the next data packet transmitted. In this manner, it would also be possible to recognize any packets that belong together.

The receiver 120 receives the transmitter-specific payload data 112-$m$ ($m=1, 2, \ldots, M$) that is transmitted from one of the transmitters 110-$m$ ($m=1, 2, \ldots, M$) to the receiver 120 via a communication channel within the time interval T by means of the plurality of channel-coded data packets. Each of the channel-coded data packets 210-$n$ ($n=1, 2, \ldots, N$) comprises packet core data 212-$n$ ($n=1, 2, \ldots, N$) at least corresponding to a packet identification of the respective channel-coded data packet 210-$n$ ($n=1, 2, \ldots, N$), the packet core data 212-$n$ ($n=1, 2, \ldots, N$) being coded with a channel code of higher redundancy than the transmitter-specific payload data 112-$m$ ($m=1, 2, \ldots, M$). The receiver 120 comprises a means (receiving unit) RX for receiving the plurality of channel-coded data packets 210-$n$ ($n=1, 2, \ldots, N$) within the time interval T, like an antenna having a downstream analog front end and a digital receiver stage, for example. In addition, the receiver 120 comprises a decoder DEC adapted to decode packet core data 212-$n$ ($n=1, 2, \ldots, N$) of a first received channel-coded data packet, e.g. 210-1, of the time interval T and, if error-free decoding of the first channel-coded data packet 210-1 fails (to obtain the transmitter-specific payload data 112-$m$), to decode packet core data of at least one further received channel-coded data packet 210-$n$ ($n=2, 3, \ldots, N$) of the time interval T so as to determine a suitable further channel-coded data packet of the time interval T for combining with the first channel-coded data packet 210-1 so as to obtain, on account of the combination, an increased code gain for decoding of the transmitter-specific payload data 112-$m$ ($m=1, 2, \ldots, M$).

In this context, the receiver 120 comprises no return channel that would lead to any of the transmitters 110-$m$ ($m=1, 2, \ldots, M$) so as to cause it to repeatedly transmit a channel-coded data packet in the event that decoding of the payload data 112 has failed.

In accordance with embodiments, the decoder DEC is configured to utilize any information about redundancy and/or payload data, said information having been obtained by decoding the first channel-coded data packet 210-1, as redundancy information for decoding the at least second channel-coded data packet 210-$n$ ($n=2, 3, \ldots, N$) so as to obtain the increased code gain.

Since at least the transmission time $t_i$ of the first data packet 210-1 for each transmitter 110-$m$ is pseudorandom, the receiver 120 will not readily recognize which receive packets belong together. This is the case particularly if the receiver 120 and/or the transmitters 110-$m$ are mobile. It would take up too much computing time and/or too many hardware resources to try out all of the possible attempts to combine data packets, and it would not be possible, or would be possible only with a large amount of computing expenditure, to operate the transmission system 100 in real time. For this reason, specific information (packet core data) about the transmission packet 210-$n$ ($n=1, 2, \ldots, N$) is accommodated in the core area 212-$n$ ($n=1, 2, \ldots, N$) of the data packet 210-$n$ ($n=1, 2, \ldots, N$), said core area having improved protection. Said information is at least the packet identification P-Id$_n$ ($n=1, 2, \ldots, N$) and advantageously also the transmitter identification S-Id$_m$ ($m=1, 2, \ldots, M$) and/or any information of the respective transmitter, said information being derived from said identification. The core area and/or the packet core data 212-$n$ ($n=1, 2, \ldots, N$) are protected with a code of higher redundancy in each case than the data field 214-$n$ ($n=1, 2, \ldots, N$). It is therefore possible to decode the packet core data 212-$n$ ($n=1, 2, \ldots, N$) even with a low signal-to-noise or signal-to-interference ratio at the receiver 120 and to thus obtain the packet identification P-Id$_n$ ($n=1, 2, \ldots, N$) and, if it exists, also the transmitter identification S-Id$_m$ ($m=1, 2, \ldots, M$). The threshold of decodability of the packet core data 212-$n$ ($n=1, 2, \ldots, N$) thus is at least as good as the threshold achieved when combining all of the possible N data packets 210-$n$ ($n=1, 2, \ldots, N$) of the transmission time frame T. Applied differently, the code gain associated with the core area 212-$n$ ($n=1, 2, \ldots, N$) corresponds at least to the code gain resulting from the combination of all of the N data packets 210-$n$ ($n=1, 2, \ldots, N$) and/or their coded payload data fields 214-$n$ ($n=1, 2, \ldots, N$).

As was already described at the outset, there are basically different possibilities of combining the received channel-coded data packets 210-$n$ ($n=1, 2, \ldots, N$) or a portion of same so as to obtain a higher code gain as a result of said combination.

Figure 3A:
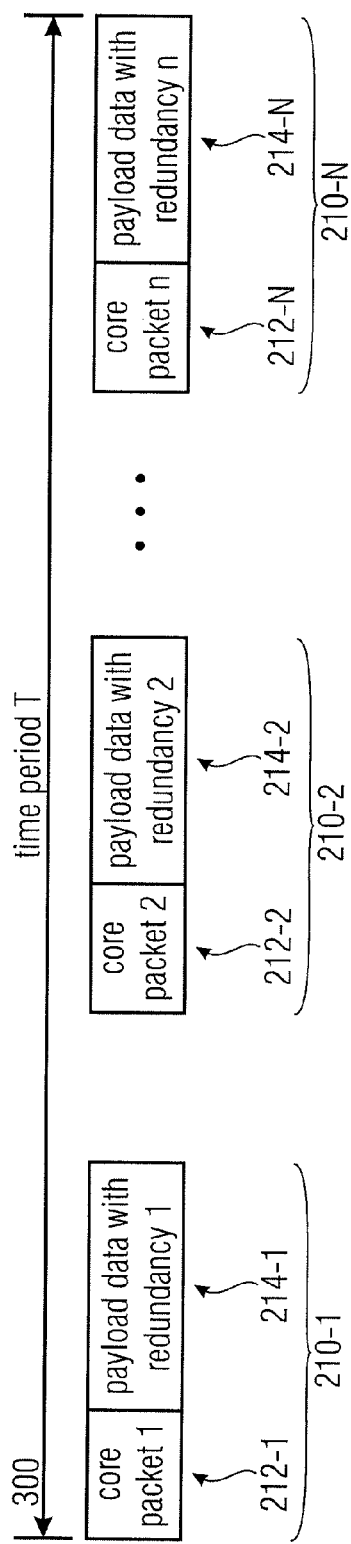
FIGS. 3a and 3b show schematic representations of a plurality of generated coded data packets in a time interval in accordance with an embodiment of the present invention.

FIG. 3$a$ shows a transmission frame 300 of a transmitter 110. Within the transmission time interval T, N channel-coded data packets 210-$n$ are sent out by the transmitter 110 at pseudorandom times $t_n$ ($n=1, 2, \ldots, N$). In accordance with an embodiment, each data packet 210-$n$ ($n=1, 2, \ldots, N$) in the data field 214-$n$ ($n=1, 2, \ldots, N$) contains the coded payload data, which is coded differently, and, therefore, the redundancy information differs from data packet to data packet. I.e., in accordance with an embodiment, the means ENC for generating is configured, for example, to generate the channel-coded data packets 210-$n$ ($n=1, 2, \ldots, N$) with respectively different redundancy information with regard to the payload data packet 112.

Figure 3B:
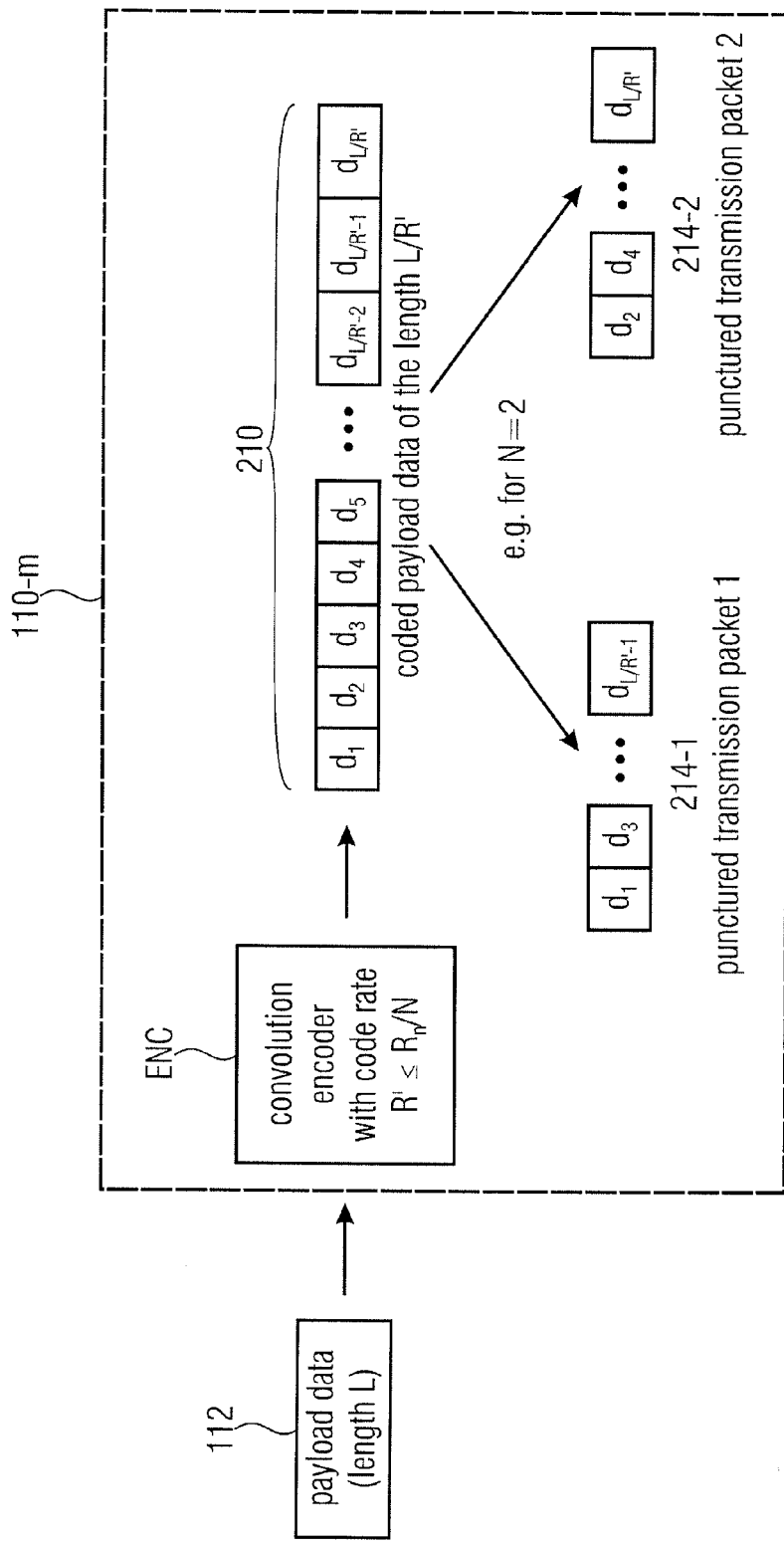
Figure 4:
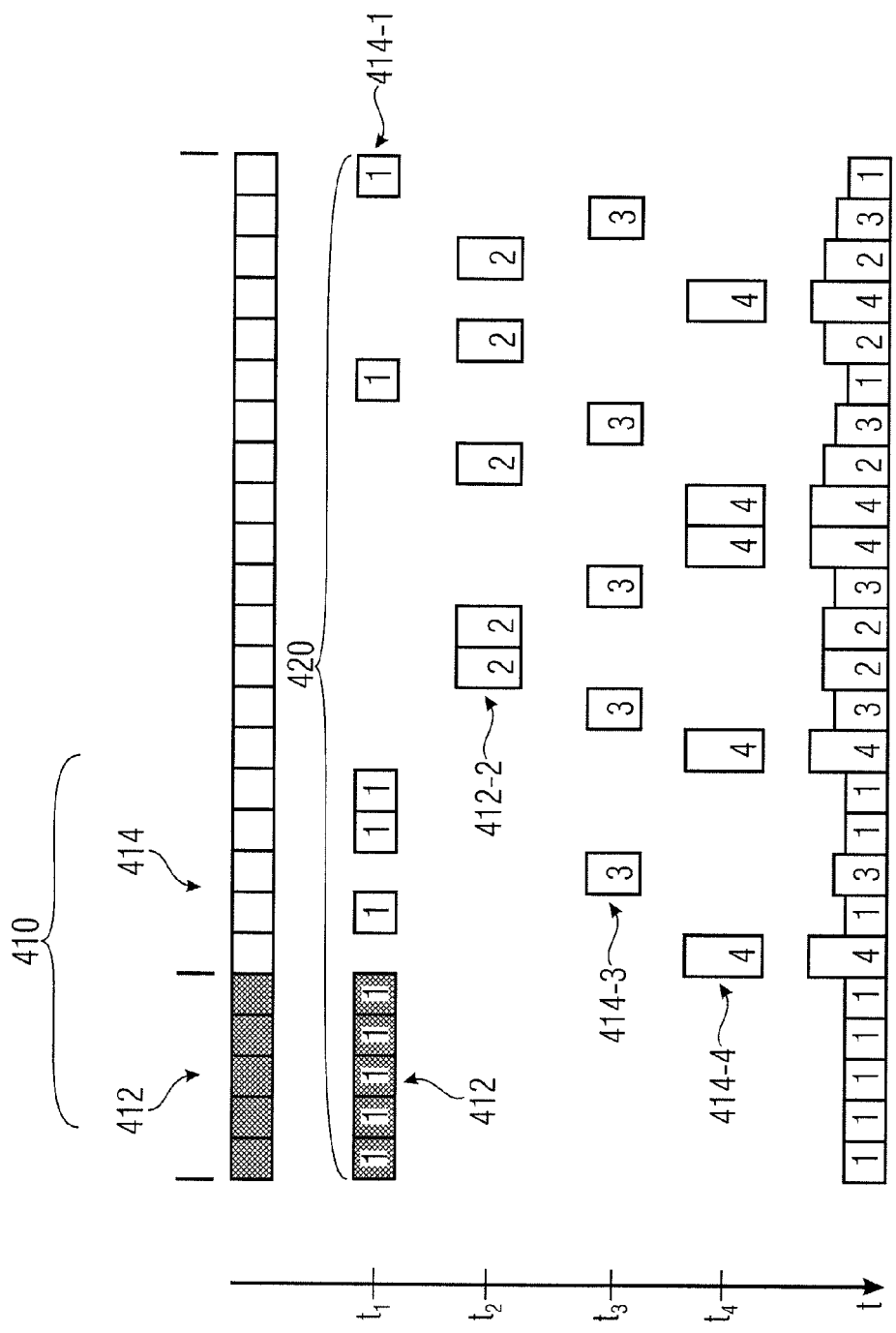
FIG. 4 shows a schematic representation of a unidirectional transmission of incremental redundancy by means of a plurality of coded data packets in accordance with a further embodiment of the present invention.
Figure 5:
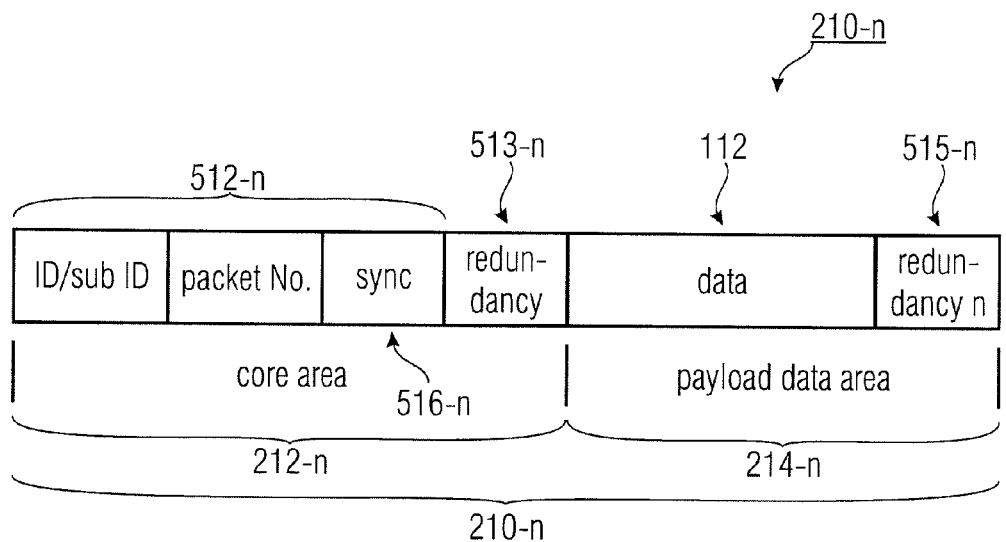
FIG. 5 shows a schematic structure of a data packet in accordance with an embodiment of the present invention.

An inventive approach to generating the channel-coded data packets 210-$n$ having respectively different coded payload data and associated redundancy information with regard to the associated original payload data packet 112 is represented by way of example by means of FIG. 3$b$. As is depicted in FIG. 3$b$, the payload data 112 of the length L is supplied to the coder ENC, e.g. a convolution encoder, at the code rate $R' \le R_n/N$, which generates a coded long data packet 210 of the length L/R' from the payload data 112. With regard to the overview shown in FIG. 3b, it shall be noted that in said overview only the coded payload data with the redundancy information (data fields 214-n) derived from the payload data are depicted in the data packets 210-n without explicitly indicating the associated core data 212-n, which may be associated, for example, with the associated data fields 214-n prior to the transmission operation.

In accordance with the invention, a so-called puncturing scheme is performed, at the convolution encoder ENC, on the long code word 210 obtained, puncturing comprising omitting and/or taking out ("puncturing") specific positions of the long code word obtained. In this manner, the resulting code rate may be increased, for example. In addition, the code word lengths may be specifically designed for a certain frame length for subsequent data transmission and/or data storage processes, for example.

As is shown by way of example in FIG. 3b, a puncturing scheme is used wherein the coded starting data packet 210 is split up into two equal parts (i.e. N=2), so that two punctured transmission packets 1 and 2 result that may be transmitted, as a coded data packet 210-1, 210-2 in each case, in the form of the coded payload and redundancy data 214-1, 214-2 with the associated core data 212-1, 212-2. The coded data packets 1 and 2 may now both comprise the same code rate $L_n$ ($R_1=R_2$) or different code rates ($R_1 \neq R_2$), for example.

If, for example, the punctured transmission packets 1 and 2 have the same code rate $R_1=R_2$, a lower combined code rate $R'=R_n/2$ will result in the event of a receiver-end combination of the first data packet 210-1 and the second data packet 210-2. If a further received channel-coded data packet 210-3 having the code rate $R_3=R_1=R_2$ (not shown in FIG. 3b) were utilized, at the receiver end, for decoding and combining, the combined code rate in this case would decrease to $R'=R_n/3$ if the data was sent in such a manner that it was coded differently 3 times accordingly. This sequence may be continued for as long as one likes. For the above explanations it was assumed that the code rate $R_n$ (with $R_1=R_2=\ldots=R_n$) is the same in each case for the data packets 210-n used for combining and decoding.

In accordance with further embodiments of the present invention it is also possible for the code rates $R_n$ (n=1, 2, ..., N) with which the payload data 112 in the associated coded data packets 210-n (e.g. with the punctured transmission packets) is coded to differ from data packet to data packet. Also, it is possible that predefined groups of data packets 210-n (e.g. with n=1, 3, . . . "odd-numbered" and/or n=2, 4 . . . "even-numbered") may have mutually different code rates. The respective group may include any selection (e.g. individual data packets, several consecutive data packets, etc.) of the data packets 210-n that are based on an associated payload data packet 112. Said association of different code rates may be effected, for example, in that the punctured data packets 210-n have different sizes, so that $R_1 \neq R_2$ results with regard to the code rates (e.g. with $R_1=\frac{1}{2}$ and $R_2=\frac{1}{3}$, etc.). For example, in a first data packet 210-1, a channel code of the rate $R_1$ may result from this, whereas in a second data packet 210-2, the coded payload data is transmitted in such a manner that it is coded with a channel code of the rate $R_2$, etc.

If, at the receiver end, decoding of the first data packet 210-1 and/or of the data field 214-1 fails on account of an SNR at the receiver 120 being too low, an effective code rate of $R'=1/(1/R_1+1/R_2)=1/(2+3)=\frac{1}{5}$ might be achieved by combining the first coded data packet 210-1 with the second coded data packet 210-2, which increases the likelihood of successful decoding of the payload data 112. The fact that the proper packets are combined with one another is ensured by previously decoding the packet core data 212-n.

In accordance with embodiments of the present invention, the encoder ENC may be configured to generate at least one predefined group or all of the coded data packets 210-n such that they are decodable by themselves with at the decoder end given a (sufficiently correct) transmission, so as to obtain the associated payload data 112. Moreover, the encoder ENC may be configured such that, additionally, also a predefined selection of the coded further data packets 210-n (n=2, 3, . . . , N) are combinable and decodable, for example by reversing (feeding back) the puncturing. For example, the plurality of channel-coded data packets 210-n may be generated from an individual, relatively long channel-coded data packet 210 by means of suitable puncturing, for example, the convolution code and the puncturing being selected such that each of the plurality of channel-coded data packets is decodable by itself and/or that all of the possible combinations of the data packets 210-n (2, 3, . . . , N data packets) are decodable by reversing the puncturing.

Said properties may be obtained, for example, by means of the selection of the generator polynomials for the convolution encoder ENC and the puncturing patterns (puncturing scheme). In addition, the generator polynomials for the convolution encoder ENC and the puncturing patterns (puncturing scheme) may be adapted to the specific data rate, coding rate and detection threshold SNR of the transmitter-receiver system. In this context, in particular, performance properties, which are predefined by the coded transmission packets 210-n, for the decoding may be obtained or set. For example, the generator polynomials for the convolution encoder ENC and the puncturing patterns may be selected such that a desired performance is achieved at the decoder end, for example irrespective of which of the coded data packets 210-n or which of the predefined groups of coded data packets are combined and decoded at the receiver end.

In addition, such embodiments are also feasible wherein, in a later data packet, the data of the first data packet 210-1 (coded payload data+redundancy) is not accurately repeated, but only additional redundancy information is transmitted that would not be decodable by itself without the data of the first data packet 210-1. I.e., in such a case, both the payload data 112 and associated redundancy information for error recognition and correction would be transmitted in the first data packet 210-1 only. In subsequent data packets 210-2, 210-3, . . . , 210-N, additional redundancy information would then be transmitted only in an incremental manner. This shall be explained in more detail with reference to FIG. 4.

At the transmitter end, the payload data 112 and error-recognizing bits (CRC) are initially coded by means of a systematic "parent" code, for example. This results in a code word 410 of systematic bits 412 and parity bits 414. In a first data field 214-1 transmitted at a time $t_1$, the systematic portion 412 of the code word and a specific number, i.e. not all, of parity bits 414-1, which together form a code word 420 of a parent code, are transmitted to the receiver 120. At a further time $t_2$, the transmitter 110 transmits, in a data field 214-2 of a subsequent coded data packet 210-2, additional parity bits 414-2 with possibly different powers or by means of different channel conditions. At a further time $t_3$, the transmitter 110 transmits additional parity bits 414-3 in a further data packet 214-3, etc.

At the receiver end, one initially attempts to decode the code word 420. If error-free decoding is not possible, a new decoding attempt is made, which includes combining the additional parity bits 414-2 of the data packet 210-2 with the previously received parity bits 414-1 of the data packet 210-1. This process may be repeated until such time as decoding of the payload data 112 is successful.

Due to the incrementally transmitted redundancy information, the effective code rate R' resulting from the combination may be adapted to the channel and/or transmission properties. In the normal case, i.e. given a good channel and/or little interference between the subscribers, only the punctured code of the first data packet 210-1 is used initially, and it is only as the channel quality decreases that the punctured locations contained in the subsequent data packets 210-2, 210-3, . . . , 210-N are utilized in order to increase correctability.

In each of the different cases, the number of data packets 210-$n$ ($n=1, 2, \ldots, N$) eventually combined for error-free decoding is inversely proportional to the receiver-end SNR. I.e., the poorer the receiving conditions, the larger the number of data packets to be combined.

FIG. 5 once again illustrates a possible structure of a data packet 210-$n$ ($n=1, 2, \ldots, N$). The core area 212-$n$ ($n=1, 2, \ldots, N$), enjoying improved protection, of the data packet 210-$n$ ($n=1, 2, \ldots, N$) contains the packet core data in the form of an optional transmitter identification number or a portion thereof (ID/Sub ID) as well as the number of the transmission packet (packet No.). Provision of the transmitter identification number or the portion thereof is advantageous, particularly in case of large subscriber numbers M.

As has already been mentioned, the core area 212-$n$ ($n=1, 2, \ldots, N$) is protected better than the payload data domain 214-$n$ ($n=1, 2, \ldots, N$) so that it may also be decoded under extremely poor channel conditions (worst case). Such poor transmission conditions occur in case of maximum temporal interference of the received data packets at the receiver 120, i.e. if all of the M subscribers accidentally transmit at the same time. Such poor transmission conditions also occur in the event of transmissions being effected over long distances.

The decoding threshold of the packet core data 212-$n$ ($n=1, 2, \ldots, N$) should in this context be at least equal to or even better than the decoding threshold of the (payload) data fields 214-$n$ ($n=1, 2, \ldots, N$) when combining all of the N data packets 210-$n$. I.e., the core area 212-$n$ ($n=1, 2, \ldots, N$) should comprise, relative to its source information 512-$n$ ($n=1, 2, \ldots, N$), an at least equal or higher amount of redundancy information 513-$n$ ($n=1, 2, \ldots, N$) as/than the sum of the redundancy information 515-$n$ ($n=1, 2, \ldots, N$) of all N data packets 210-$n$ ($n=1, 2, \ldots, N$) of a transmission time interval T. For example, the core area 212-$n$ ($n=1, 2, \ldots, N$) might be protected with a convolution code of the rate $\frac{1}{4}$, whereas the payload data 112 is protected with an effective convolution code of the rate $\frac{1}{2}$. If one were to split up the coded payload data 214-$n$ to N=2 payload data packets, each data packet by itself would have the rate 1 and, therefore, no additional redundancy. When combining the two blocks in the receiver 120, e.g. the information of the second packet 210-2 might be used as redundancy information of the first packet 210-1.

If the payload data is coded by a convolution code of the rate $\frac{1}{2}$, the amount (number) of coded payload data is double the amount of the non-coded payload data. If double the amount of coded payload data is transferred into data packets, the length of a data packet will be equal to the length of the uncoded payload data. If one considers the code rate between the uncoded payload data and the coded payload data of a data packet, the code rate 1 will result. Partitioning of the data to both data packets may be performed such that each data packet is decodable by itself, and that the code rate $\frac{1}{2}$ results when the two data packets are combined in the receiver. Thus, the coded payload data is split up into two data packets that are sent out by the transmitter at different times.

In addition to the higher redundancy in the core area 212-$n$ ($n=1, 2, \ldots, N$), it is also advantageous to provide, in the core area, one synchronization word 516-$n$ ($n=1, 2, \ldots, N$) in each case, with help of which the receiver 120 may synchronize itself as fast as possible. Said synchronization, or the synchronization word 516-$n$ ($n=1, 2, \ldots, N$), is used in each data packet 210-$n$ ($n=1, 2, \ldots, N$) since in a multi-subscriber system, each transmitter comprises its own reference clock source (oscillator) having different tolerances. In accordance with a further embodiment, the means ENC for generating is also configured to further provide the packet core data 212-$n$ ($n=1, 2, \ldots, N$) of a channel-coded data packet 210-$n$ ($n=1, 2, \ldots, N$) with synchronization data 516-$n$ ($n=1, 2, \ldots, N$) so as to enable the receiver 120 to detect the channel-coded data packet 210-$n$ ($n=1, 2, \ldots, N$) from the transmitter 110-$m$ ($m=1, 2, \ldots, M$). For example, the synchronization data 516-$n$ ($n=1, 2, \ldots, N$) might be a so-called Manchester code. The Manchester code is a line code which obtains the clock signal during coding. In this context, a bit sequence modulates the phasing of a clock signal in a binary manner. The detection threshold, i.e. the SNR, at which the receiver 120 recognizes an individual receive packet 210-$n$ ($n=1, 2, \ldots, N$) is dependent on an overall sensitivity of the receiver 120, which results when all of the receive packets 210-1, 210-2, . . . , 210-N are combined. I.e., the more data packets 210-$n$ are combinable, the more the reception threshold will decrease, and the higher the requirements placed upon the synchronization of the receiver 120 will be.

The transmitters send out their data packets 210-$n$ ($n=1, 2, \ldots, N$) at pseudorandom times that are initially not known to the receiver 120. If, additionally, the receiver 120 is also mobile rather than stationary, the transmitters located in the reception range of the receiver 120 will constantly change. If a transmitter 110-$m$ additionally sends out, in accordance with the invention, redundant data packets for code combining, the receiver 120 should be able to associate the data packets with a transmitter so that the proper data packets may be combined. Association of the receive packets with a transmitter will become difficult when the packet core data of an individual data packet cannot be unambiguously decoded due to the interference in the transmission channel. Precisely in this case, the decodability of the payload data 112-$m$ is to be improved by combining several redundant data packets. If, therefore, in a disturbed transmission channel, many receive packets were received from several transmitters in an incomplete manner and have to be combined with one another, this may be effected, for example, by trying all of the combination possibilities. In the case mentioned here, incomplete reception makes itself felt, for example, in that the data packets cannot be unambiguously associated with a transmitter since, e.g., the ID was received incorrectly.

In the event of there being a small number of transmitters, this may still be practicable. However, if the number of receive packets increases, e.g. because a very large number of transmitters are located in the reception range of the receiver, the computing power necessitated for different combination possibilities increases exponentially as a result. In accordance with embodiments of the present invention, however, said combination possibilities in the receiver 120 may be restricted in a targeted manner, whereby the processing speed of the receiver 120 may be increased.

The increased protection of the transmitter and packet identification in the core area 212-$n$ ($n=1, 2, \ldots, N$) may ensure, even in case of poor reception, that each receive packet 210-$n$ ($n=1, 2, \ldots, N$) may be unambiguously associated. Thus, data packets of identical transmitters may be combined in the receiver 120, and computing expenditure for mis-combinations that would arise by randomly combining any data packets can be avoided. With regard to the term "mis-combinations" it shall be noted that said term does not relate to missing combinations but to combinations that do not lead to payload data transmitted, i.e. to combinations yielding a wrong result. In the case of very long transmitter identifications, which may lie at about 48 bits and more, a large amount of redundancy information would be transmitted in the core area 212-$n$ ($n=1, 2, \ldots, N$) when using the entire transmitter identification, which may lead to increased energy consumption and, thus, shortened battery life of the corresponding transmitter 110-$m$. To avoid this, it is also possible, in accordance with an embodiment, to transmit only a portion of the transmitter identification (sub ID) in the core area 212-$n$ ($n=1, 2, \ldots, N$) or only a relatively small MAC (message authentication code) address. Consequently, unambiguous association of data packets 210-$n$ ($n=1, 2, \ldots, N$) with a transmitter 110-$m$ is no longer possible, however, since several transmitters can use the same partial identification in the core area 212-$n$ ($n=1, 2, \ldots, N$), so that this again may result in mis-combinations. However, their number is far smaller than in a unidirectional multi-subscriber system without any transmitter identification in the protected core area 212-$n$ ($n=1, 2, \ldots, N$).

In accordance with further embodiments of the present invention, the number of possible packet combinations may be limited by exploiting time information. Typically, the data packets 210-$n$ ($n=1, 2, \ldots, N$) are transmitted by the transmitter 110-$m$ in a random manner, but only within a certain transmission time window T. While exploiting this time information, the receiver 120 may further limit the number of possible data packet combinations. I.e., in accordance with embodiments, the decoder DEC is configured, at the receiver end, to utilize information about the transmission time interval T for decoding the packet core data 212-$n$ ($n=2, 3, \ldots, N$) of the at least second channel-coded data packet 210-$n$ ($n=2, 3, \ldots, N$) from the transmitter 110-$m$, such that starting from the first channel-coded data packet 210-1, the at least second channel-coded data packet 210-$n$ ($n=2, 3, \ldots, N$) was received one time period, which corresponds to the time interval T, earlier or later at a maximum.

Figure 6:
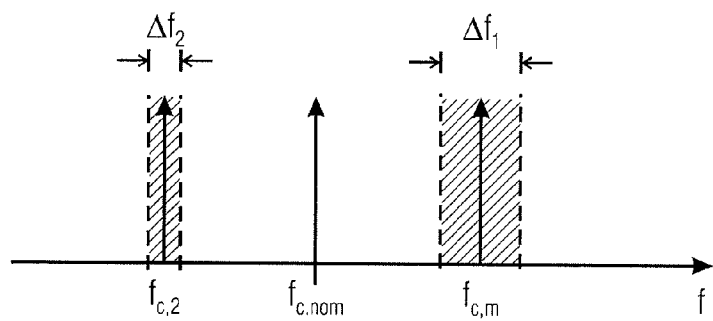
FIG. 6 shows a schematic representation of a transmitter-specific frequency offset relative to a nominal transmitting frequency.

A further approach to reducing possible data packet combinations results from different frequency offsets of the individual transmitters 110-$m$ with regard to a nominal transmitting frequency $f_{c,nom}$. This transmitter-specific frequency offset is typically—this is different from transmitter to transmitter—in a range of up to ±100 ppm (parts per million), so that the individual transmitters have slightly different transmitting frequencies $f_{c,m}$ ($m=1, 2, \ldots, M$) around the nominal transmitting frequency $f_{c,nom}$ (see FIG. 6). As a matter of principle, the frequency offset $\Delta f_m$ ($m=1, 2, \ldots, M$) per transmitter intermittently lies in a range of less than ±10 ppm, however. A frequency offset of a transmitter relative to the nominal transmitting frequency may arise, for example, due to manufacturing tolerances of the quartz crystal oscillator. Said frequency offset exists over a long period of time. In addition, a frequency offset may be caused by aging of components. Said frequency offset, too, only changes slowly over time. An intermittent change in the frequency offset may be caused by a rapid temperature change in the electronic circuit, for example.

If the receiver is additionally configured to perform a frequency estimation of the received signal, said information may be used for correctly combining data packets. In accordance with embodiments, the receiver 120 may detect, for example, a frequency offset which amounts to $\Delta f_m$ ($m=1, 2, \ldots, M$) and lies within the range of less than 10 ppm around $f_{c,m}$ ($m=1, 2, \ldots, M$). The receiver may detect the offset of the transmitting frequency $f_{c,m}$, it being possible for said frequency offset to have a fluctuation of $\Delta f_m$. The frequency offset of a data packet may be used as association with a transmitter. Said frequency offset should be in the range $\Delta f_m$ around $f_{c,m}$ so that the data packet is associated with the correct transmitter. This can be used for further limiting the number of possible data packet combinations, since only such receive packets are combined whose frequency offset $\Delta f_m$ lies within a certain limit. I.e., the decoder DEC of the receiver 120 is configured, in accordance with some embodiments, to determine and utilize information about a transmitter-specific deviation $\Delta f_m$ ($m=1, 2, \ldots, M$) of an actual transmitting frequency $f_{c,m}$ ($m=1, 2, \ldots, M$) of the transmitter 110-$m$ from a nominal transmitting frequency $f_{c,nom}$ for decoding the at least second channel-coded data packet 210-$n$ ($n=2, 3, \ldots, N$) of the transmitter 110-$m$ and of the time interval T, such that channel-coded data packets received with the transmitter-specific deviation may be associated with the transmitter 110-$m$. The parameter $\Delta f_m$ characterizes the frequency range around $f_{c,m}$ in which a data packet may be associated with another data packet. For example, if $\Delta f_m$ is at 10 Hz with $f_{c,1}=6000$ Hz, and if, for example, a data packet is received at a frequency of 6004 Hz, said data packet may be associated with a data packet having 6002 Hz.

Embodiments of the present invention may be employed, e.g., for realizing a system for transmitting relatively small data quantities, for example sensor data of, e.g., heating, electricity or water meters. In this context, a measuring means comprising a radio transmitter in accordance with an embodiment of the present invention may be mounted on the meters/sensors, said radio transmitter wirelessly transmitting the sensor data and/or payload data to a central receiver 120 in the above-described manner. Accordingly, embodiments of the present invention also include a communication system comprising at least one transmitter 110 and one receiver 120 in accordance with the embodiments described herein. Such a communication system exhibits no return channel from the receiver 120 to any transmitter 110-$m$ ($m=1, 2, \ldots, M$), and each transmitter transmits its data packets 210-$n$ ($n=1, 2, \ldots, N$) at a random or pseudorandom time $t_n$ ($n=1, 2, \ldots, N$) not known to the receiver 120. Thus, the receiver 120 receives a large number of transmit signals of different meters and/or sensors.

Even though some aspects of the present invention were described in connection with transmit/receive devices, it shall be understood that said aspects also represent a description of corresponding transmit/receive methods, so that a block or a component of a transmit/receive device should also be understood as a corresponding method step or as a feature of a method step. By analogy thereto, aspects described in connection with or as a method step also represent a description of a corresponding block or detail or feature of a corresponding device.

Depending on specific implementation requirements, embodiments of the invention may be implemented in hardware or in software. Implementation may be performed using a digital storage medium, for example a floppy disc, a DVD, a Blu-ray disc, a CD, a ROM, a PROM, an EPROM, an EEPROM, or a flash memory, a hard disc or any other magnetic or optical memory which has electronically readable control signals stored thereon that may cooperate, or indeed do cooperate, with a programmable computer system such that the respective transmission/reception method is performed. This is why the digital storage medium may be computer-readable. Some embodiments in accordance with the invention thus include a data carrier having electronically readable control signals that are capable of cooperating with a programmable computer system or a digital signal processor such that any of the methods described herein is performed.

In some embodiments, a programmable logic device (e.g. a field-programmable gate array, an FPGA) may be used for performing some or all of the functionalities of the methods described herein. In some embodiments, a field-programmable gate array may cooperate with a microprocessor to perform any of the methods described herein. In some embodiments, the methods are generally performed by any hardware device. The latter may be a universally employable hardware such as a computer processor (CPU) or a hardware specific to the method, such as an ASIC, for example.

The above-described embodiments merely represent an illustration of the principles of the present invention. It is to be understood that modifications and variations of the arrangements and details described herein will be appreciated by other persons skilled in the art. This is why it is intended that the invention be limited only by the scope of the following claims rather than by the specific details that were presented herein by means of the description and the explanation of the embodiments.

The invention claimed is:

1. A transmitter apparatus configured to transmit payload data via a unidirectional communication to a receiver apparatus within a time interval, comprising:
   a generator configured to generate a plurality of channel-coded data packets from the same payload data, each of the channel-coded data packets comprising packet core data corresponding to a packet identification which is different for each data packet, and the packet core data being coded with a channel code of a higher redundancy than the payload data; and
   a transmitter configured to transmit the plurality of channel-coded data packets to the receiver apparatus within the time interval, the transmitter being configured to transmit the plurality of channel-coded data packets from the transmitter apparatus to the receiver apparatus within the time interval without using a return channel; wherein
   if a transmission of the channel-coded data packets is sufficiently error-free, the channel-coded data packets are individually decodable, by themselves, to provide the payload data; and
   if a transmission of the channel-coded data packets is not sufficiently error-free, at least two of the channel-coded data packets are combinable to provide, according to the combination of the at least two of the channel-coded data packets, an increased code gain to decode the channel-coded data packets to provide the payload data.

2. The transmitter apparatus as claimed in claim 1, wherein the transmitter is configured to transmit the plurality of channel-coded data packets from the transmitter apparatus to the receiver apparatus within the time interval in a manner that is independent of a return channel from the receiver apparatus to the transmitter apparatus with regard to a reception of the plurality of channel-coded data packets and/or of success or failure of decoding the payload data.

3. The transmitter apparatus as claimed in claim 1, wherein the transmitter is configured to transmit a first one of the plurality of channel-coded data packets at a random time and to subsequently transmit any remaining data packets of the plurality of channel-coded data packets within the time interval.

4. The transmitter apparatus as claimed in claim 3, wherein the transmitter is configured to transmit the plurality of channel-coded data packets at predetermined time lags within the time interval after the random point in time.

5. The transmitter apparatus as claimed in claim 1, wherein the transmitter is configured to transmit the plurality of channel-coded data packets within the time interval in accordance with time division multiple access.

6. The transmitter apparatus as claimed in claim 1, wherein the generator is configured to provide each of the channel-coded data packets with packet core data corresponding to the packet identification of the respective channel-coded data packet and to at least a portion of a transmitter identification of the transmitter apparatus.

7. The transmitter apparatus as claimed in claim 1, wherein the generator is configured to generate the channel-coded data packets with items of redundancy information that are different, respectively, with regard to the payload data.

8. The transmitter apparatus as claimed claim 1, wherein the generator is configured to further provide the packet core data of a channel-coded data packet with synchronization data so as to enable the receiver apparatus to detect the channel-coded data packet from the transmitter apparatus.

9. The transmitter apparatus as claimed in claim 1, coupled to a measuring device, in particular a heating, electricity or water meter, so that the payload data is provided to the transmitter apparatus in the form of measurement data from the measuring device.

10. The transmitter apparatus as claimed in claim 1, wherein the generator is configured to generate the channel-coded data packets from the payload data packet according to a convolution code and a puncturing scheme, so that each channel-coded data packet of a predefined group of channel-coded data packets based on an associated payload data packet is decodable independently of the other channel-coded data packets of the group.

11. The transmitter apparatus as claimed in claim 10, wherein the generator is further configured such that at least a predefined selection of combinations of the channel-coded data packets based on the associated payload data packet are decodable.

12. A receiver apparatus configured to receive payload data transmitted from a transmitter apparatus to the receiver apparatus via a unidirectional communication to the receiver apparatus within a time interval T according to a plurality of channel-coded data packets generated from the same payload data, the receiver apparatus comprising no return channel that would lead to the transmitter apparatus for causing the transmitter apparatus to repeatedly transmit a channel-coded data packet in the event that decoding of the payload data has failed, each of the channel-coded data packets comprising packet core data corresponding to a packet identification of the respective channel-coded data packet, and the packet core data being coded with a channel code of higher redundancy than the payload data, wherein, if a transmission of the channel-coded data packets is not sufficiently error-free, the channel-coded data packets are individually decodable, by themselves, to provide the payload data, and wherein, if a transmission of the channel-coded data packets is not sufficiently error-free, at least two of the channel-coded data packets are combinable to provide, according to the combination of the at least two of the channel-coded data packets, an increased code gain to decode the channel-coded data packets to provide the payload data, the receiver comprising:
   a receiver configured to receive the plurality of channel-coded data packets within the time interval; and
   a decoder adapted to decode packet core data of a first received channel-coded data packet of the time interval, and, in the event of failure of error-free decoding of the first channel-coded data packet, to decode packet core data of at least one second received channel-coded data packet of the time interval so as to determine a suitable further channel-coded data packet of the time interval for combination with the first channel-coded data packet so as to acquire, on account of the combination, the increased code gain for decoding of the payload data.

13. The receiver apparatus as claimed in claim 12, wherein the decoder is configured to utilize any information acquired by decoding the first channel-coded data packet as redundancy information for decoding the second or a further channel-coded data packet, or vice versa, so as to acquire the increased code gain.

14. The receiver apparatus as claimed in claim 12, wherein the decoder is configured to utilize information about the time interval for decoding the packet core data of the at least second channel-coded data packet from the transmitter apparatus and of the time interval, such that starting from the first channel-coded data packet, the at least second channel-coded data packet was received one time period, which corresponds to the time interval, earlier or later at a maximum.

15. The receiver apparatus as claimed in claim 12, wherein the decoder is configured to determine and utilize information about a transmitter-specific deviation of an actual transmitting frequency of the transmitter apparatus from a nominal transmitting frequency for decoding the packet core data of the at least second channel-coded data packet of the transmitter apparatus and of the time interval, such that channel-coded data packets received with the transmitter-specific deviation may be associated with the transmitter apparatus.

16. The receiver apparatus as claimed in claim 12, wherein the decoder is configured to decode a channel-coded data packet of a predefined group of channel-coded data packets, which are based on an associated payload data packet, independently of the other channel-coded data packets of the group.

17. The receiver apparatus as claimed in claim 16, wherein the decoder is configured to decode at least a predefined selection of combinations of the channel-coded data packets based on the associated payload data packet.

18. A system for transmitting payload data from a transmitter apparatus to a receiver apparatus via a unidirectional communication to a receiver apparatus within a time interval, comprising:
a generator configured to generate a plurality of channel-coded data packets from the payload data, each of the channel-coded data packets comprising packet core data corresponding to a packet identification of the respective channel-coded data packet, and the packet core data being coded with a channel code of a higher redundancy than the payload data; and
a transmitter configured to transmit the plurality of channel-coded data packets within the time interval;
if a transmission of the channel-coded data packets is not sufficiently error-free, the channel-coded data packets are individually decodable, by themselves, to provide the payload data;
if a transmission of the channel-coded data packets is not sufficiently error-free, at least two of the channel-coded data packets are combinable to provide, according to the combination of the at least two of the channel-coded data packets, an increased code gain to decode the channel-coded data packets to provide the payload data;
the system further includes a receiver and a decoder;
the receiver is configured to receive the plurality of channel-coded data packets within the time interval;
the decoder is configured to decode packet core data of a first received channel-coded data packet of the time interval, and, if error-free decoding of the first channel-coded data packet so as to acquire the payload data fails, to decode packet core data of at least one second received channel-coded data packet of the time interval so as to determine a suitable further channel-coded data packet of the time interval for combination with the first channel-coded data packet so as to acquire, on account of the combination, the increased code gain for decoding of the payload data; and
no return channel is provided between the receiver apparatus and the transmitter apparatus for causing the transmitter apparatus to repeatedly transmit a channel-coded data packet in the event that decoding of the payload data has failed.

19. A method of transmitting payload data via a unidirectional communication to a receiver apparatus within a time interval, comprising:
generating a plurality of channel-coded data packets from the payload data, each of the channel-coded data packets comprising packet core data corresponding to a packet identification which is different for each data packet, and the packet core data being coded with a channel code of a higher redundancy than the payload data; and
transmitting the plurality of channel-coded data packets to the receiver apparatus within the time interval, said transmission of the plurality of channel-coded data packets from the transmitter apparatus to the receiver apparatus being effected within the time interval without using a return channel; wherein
if a transmission of the channel-coded data packets is not sufficiently error-free, the channel-coded data packets are individually decodable, by themselves, to provide the payload data; and
if a transmission of the channel-coded data packets is not sufficiently error-free, at least two of the channel-coded data packets are combinable to provide, according to the combination of the at least two of the channel-coded data packets, an increased code gain to decode the channel-coded data packets to provide the payload data.

20. The method as claimed in claim 19, in accordance with which a plurality of transmitter apparatuses transmit transmitter-specific payload data packets to the receiver apparatus, each transmitter apparatus generating a plurality of channel-coded, transmitter-specific data packets from the transmitter-specific payload data packet, and each of the channel-coded, transmitter-specific data packets comprising channel-coded, transmitter-specific packet core data corresponding to a packet identification of the respective channel-coded data packet and to at least a portion of the transmitter identification of the transmitter apparatus, the transmitter-specific packet core data being coded with a channel code of higher redundancy than the transmitter-specific payload data packet.

21. The method as claimed in claim 19, wherein transmission of the plurality of channel-coded data packets within the time interval is performed independently of reception of the plurality of channel-coded data packets and/or of success or failure of decoding of the payload data.

22. The method as claimed in claim 19, wherein the channel-coded data packets are generated from the payload data packet according to a convolution code and a puncturing scheme, so that each channel-coded data packet of a predefined group of channel-coded data packets based on an associated payload data packet is decodable independently of the other channel-coded data packets of the group.

23. The method as claimed in claim 22, wherein the channel-coded data packets are generated from the payload data packet according to the convolution code and the puncturing scheme, so that at least a predefined selection of combinations of the channel-coded data packets based on the associated payload data packet are decodable.

24. A method of receiving payload data transmitted from a transmitter apparatus via a unidirectional communication to a receiver apparatus within a time interval according to a plurality of channel-coded data packets generated from the same payload data, each of the channel-coded data packets comprising packet core data corresponding to a packet identification which is different for each data packet, and the packet core data being coded with a channel code of higher redundancy than the payload data, wherein, if a transmission of the channel-coded data packets is not sufficiently error-free, the channel-coded data packets are individually decodable, by themselves, to provide the payload data, and wherein, if a transmission of the channel-coded data packets is not sufficiently error-free, at least two of the channel-coded data packets are combinable to provide, according to the combination of the at least two of the channel-coded data packets, an increased code gain to decode the channel-coded data packets to provide the payload data, the method comprising:

receiving the plurality of channel-coded data packets within the time interval;

decoding packet core data of a first channel-coded data packet of the time interval; and in the event of failure of decoding of the first channel-coded data packet, decoding packet core data of at least one second channel-coded data packet of the time interval so as to determine a suitable further channel-coded data packet of the time interval for combination with the first channel-coded data packet so as to acquire, on account of the combination, the increased code gain for decoding of the payload data, said decoding of the packet core data being effected independently of a return channel from the receiver apparatus to the transmitter apparatus without causing repeated transmission of a channel-coded data packet in the event that decoding of the payload data has failed.

25. The method of receiving payload data as claimed in claim 24, wherein a channel-coded data packet of a predefined group of channel-coded data packets based on an associated payload data packet is decoded independently of the other channel-coded data packets of the group.

26. The method of receiving payload data as claimed in claim 25, wherein a predefined selection of combinations of the channel-coded data packets based on the associated payload data packet are decoded.

27. A receiver apparatus configured to receive payload data transmitted from a transmitter apparatus to the receiver apparatus via a communication channel within a time interval T according to a plurality of channel-coded data packets generated from the same payload data, each of the channel-coded data packets comprising packet core data corresponding to a packet identification of the respective channel-coded data packet, and the packet core data being coded with a channel code of higher redundancy than the payload data, wherein, if a transmission of the channel-coded data packets is not sufficiently error-free, the channel-coded data packets are individually decodable, by themselves, to provide the payload data, and wherein, if a transmission of the channel-coded data packets is not sufficiently error-free, at least two of the channel-coded data packets are combinable to provide, according to the combination of the at least two of the channel-coded data packets, an increased code gain to decode the channel-coded data packets to provide the payload data, the receiver comprising:

a receiver configured to receive the plurality of channel-coded data packets within the time interval; and a decoder adapted to decode packet core data of a first received channel-coded data packet of the time interval, and, in the event of failure of error-free decoding of the first channel-coded data packet, to decode packet core data of at least one second received channel-coded data packet of the time interval so as to determine a suitable further channel-coded data packet of the time interval for combination with the first channel-coded data packet so as to acquire, on account of the combination, the increased code gain for decoding of the payload data;

wherein the decoder is configured to determine and utilize information about a transmitter-specific deviation of an actual transmitting frequency of the transmitter apparatus from a nominal transmitting frequency for decoding the packet core data of the at least second channel-coded data packet of the transmitter apparatus and of the time interval, such that channel-coded data packets received with the transmitter-specific deviation may be associated with the transmitter apparatus.

28. A receiver apparatus configured to receive payload data transmitted from a transmitter apparatus to the receiver apparatus via a communication channel within a time interval T according to a plurality of channel-coded data packets generated from the same payload data, each of the channel-coded data packets comprising packet core data corresponding to a packet identification of the respective channel-coded data packet, and the packet core data being coded with a channel code of higher redundancy than the payload data, wherein, if a transmission of the channel-coded data packets is not sufficiently error-free, the channel-coded data packets are individually decodable, by themselves, to provide the payload data, and wherein, if a transmission of the channel-coded data packets is not sufficiently error-free, at least two of the channel-coded data packets are combinable to provide, according to the combination of the at least two of the channel-coded data packets, an increased code gain to decode the channel-coded data packets to provide the payload data, the receiver comprising:

a receiver configured to receive the plurality of channel-coded data packets within the time interval; and a decoder adapted to decode packet core data of a first received channel-coded data packet of the time interval, and, in the event of failure of error-free decoding of the first channel-coded data packet, to decode packet core data of at least one second received channel-coded data packet of the time interval so as to determine a suitable further channel-coded data packet of the time interval for combination with the first channel-coded data packet so as to acquire, on account of the combination, the increased code gain for decoding of the payload data;

wherein the decoder is configured to utilize information about the time interval for decoding the packet core data of the at least second channel-coded data packet from the transmitter apparatus and of the time interval, such that starting from the first channel-coded data packet, the at least second channel-coded data packet was received one time period, which corresponds to the time interval, earlier or later at a maximum.

* * * * *